(12) United States Patent
Morisawa et al.

(10) Patent No.: US 8,367,431 B2
(45) Date of Patent: Feb. 5, 2013

(54) MANUFACTURING METHOD OF SEMICONDUCTOR PHOTONIC DEVICE SUBSTRATE

(75) Inventors: Toshihiro Morisawa, Yokohama (JP); Takehiko Tani, Hitachi (JP); Hisataka Nagai, Hitachi (JP); Takashi Furuya, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 179 days.

(21) Appl. No.: 12/766,684

(22) Filed: Apr. 23, 2010

(65) Prior Publication Data

US 2011/0003413 A1    Jan. 6, 2011

(30) Foreign Application Priority Data

Jul. 3, 2009 (JP) ................................. 2009-159182

(51) Int. Cl.
*G01R 31/26* (2006.01)
(52) U.S. Cl. .................... 438/14; 257/E21.53; 700/121; 702/170
(58) Field of Classification Search .................. 700/121; 702/170; 438/5, 7, 14, 16
See application file for complete search history.

(56) References Cited

U.S. PATENT DOCUMENTS 6,887,727 B2 * 5/2005 Takeuchi et al. ............... 438/22
2008/0220546 A1 * 9/2008 Kinoshita ....................... 438/16

FOREIGN PATENT DOCUMENTS

| JP | 2000-053494 A | 2/2000 |
| JP | 2007-246341 A | 9/2007 |
| JP | 2008-117887 A | 5/2008 |

* cited by examiner

*Primary Examiner* — Charles Garber
*Assistant Examiner* — Reema Patel
(74) *Attorney, Agent, or Firm* — Foley & Lardner LLP

(57) ABSTRACT

In a manufacturing method of a semiconductor photonic device substrate, before multi-layer films different in material composition are successively and gradually crystal-grown in one chamber, an inter-layer growth rate model showing a relation in growth rate between each layer is defined, a growth rate of a film corresponding to at least one or more layers is obtained by actual crystal growth using an individual substrate, a growth rate of a film corresponding to other layers is estimated from the obtained growth rate by the inter-layer growth rate model, and a growth time is determined in accordance with a film thickness of each layer of the semiconductor photonic device substrate based on the actually obtained growth rate and the estimated growth rate. These steps are carried out by using a computer system connected to an MOCVD equipment, and then, a crystal growth of the semiconductor photonic device substrate is performed.

7 Claims, 10 Drawing Sheets

PRIOR ART

PRIOR ART

FIG. 3

| No. | Item |
|---|---|
| 1 | equipment availability check (pre-conditioning interim operation) — 301 |
| 2 | temperature check (growth rate check) — 302 |
| 3 | flow rate preinspection for composition 1 — 303 |
| 4 | flow rate preinspection for composition 2 — 304 |
| 5 | flow rate preinspection for composition 3 — 305 |
| 6 | growth rate preinspection for buffer layer — 306 |
| 7 | growth rate preinspection for DBR layer 1 — 307 |
| 8 | growth rate preinspection for DBR layer 2 — 308 |
| 9 | growth rate preinspection for current diffusion layer — 309 |
| 10 | growth rate preinspection for n-clad layer — 310 |
| 11 | growth rate preinspection for active layer (well layer) — 311 |
| 12 | growth rate preinspection for active layer (barrier layer) — 312 |
| 13 | growth rate preinspection for p-clad layer — 313 |
| 14 | growth rate preinspection for current diffusion layer (current correction layer) — 314 |
| 15 | active layer emission preinspection — 315 |
| 16 | DBR layer reflection preinspection — 316 |
| 17 | equipment pre-conditioning interim operation before mass production — 317 |

PRIOR ART

FIG. 7

| | ① | ② | ③ | ④ | ⑤ | ⑥ | ⑦ | ⑧ | ⑨ | ⑩ |
|---|---|---|---|---|---|---|---|---|---|---|
| ① temperature check | 1 | | | | | | | | | |
| ② DBR layer 1 | 0.95 | 1 | | | | | | | | |
| ③ buffer layer | 0.95 | 0.89 | 1 | | | | | | | |
| ④ current diffusion layer | 0.96 | 0.95 | 0.95 | 1 | | | | | | |
| ⑤ n-clad layer | 0.92 | 0.85 | 0.85 | 0.90 | 1 | | | | | |
| ⑥ active layer (well layer) | 0.95 | 0.95 | 0.89 | 0.94 | 0.92 | 1 | | | | |
| ⑦ active layer (barrier layer) | 0.95 | 0.93 | 0.88 | 0.93 | 0.96 | 0.97 | 1 | | | |
| ⑧ p-clad layer | 0.93 | 0.89 | 0.91 | 0.93 | 0.94 | 0.95 | 0.95 | 1 | | |
| ⑨ current diffusion layer (current correction layer) | 0.96 | 0.92 | 0.97 | 0.94 | 0.86 | 0.90 | 0.91 | 0.91 | 1 | |
| ⑩ DBR layer 2 | 0.36 | 0.26 | 0.20 | 0.25 | 0.29 | 0.26 | 0.31 | 0.18 | 0.34 | 1 |

0.9 or more

FIG. 8

|   |                            | ① | ② | ③ | ④ | ⑤ | ⑥ | ⑦ | ⑧ |
|---|----------------------------|------|------|------|------|------|------|------|------|
| ① | temperature check          | 1    |      |      |      |      |      |      |      |
| ② | buffer layer               | 0.28 | 1    |      |      |      |      |      |      |
| ③ | DBR layer 1                | 0.66 | 0.33 | 1    |      |      |      |      |      |
| ④ | current diffusion layer    | 0.89 | 0.48 | 0.86 | 1    |      |      |      |      |
| ⑤ | n-clad layer               | 0.61 | 0.80 | 0.71 | 0.84 | 1    |      |      |      |
| ⑥ | active layer (well layer)  | 0.66 | 0.58 | 0.75 | 0.84 | 0.90 | 1    |      |      |
| ⑦ | active layer (barrier layer)| 0.47 | 0.60 | 0.72 | 0.68 | 0.80 | 0.94 | 1    |      |
| ⑧ | p-clad layer               | 0.79 | 0.69 | 0.77 | 0.91 | 0.92 | 0.94 | 0.86 | 1    |

0.9 or more
0.7 to 0.9

US 8,367,431 B2

MANUFACTURING METHOD OF SEMICONDUCTOR PHOTONIC DEVICE SUBSTRATE

CROSS-REFERENCE TO RELATED APPLICATION

The present application claims priority from Japanese Patent Application No. 2009-159182 filed on Jul. 3, 2009, the content of which is hereby incorporated by reference into this application.

TECHNICAL FIELD OF THE INVENTION

The present invention relates to a method for omitting a growth rate preinspection operation by estimating a growth rate of crystal growth in the manufacture of a semiconductor photonic device such as an LED (Light Emitting Diode) in which multi-layer thin films different in composition need to be crystal-grown on a substrate (wafer) by using an MOCVD (Metal Organic Chemical Vapor Deposition, also referred to as MOVPE (Metal Organic Vapor Phase Epitaxy) equipment. After maintenance, only apart of the films with certain compositions are crystal-grown by using an individual substrate to perform the preinspection of the growth rate, and then, the growth rates of the films with other compositions are estimated based on the growth rates of the crystal-grown films. The present invention includes a method for determining a model relating to the growth rate of the films with various compositions and a method for determining a model parameter using actual results of the growth rate preinspection after a plurality of maintenances.

BACKGROUND OF THE INVENTION

The semiconductor photonic device substrate is formed by stacking compound semiconductors with various compositions on a substrate made of, for example, GaAs, SiC or sapphire. The compound semiconductors are generally compounds of group-III elements such as Al, Ga, and In and group-V elements such as N, P and As.

FIG. 1 shows an example of a cross section of a semiconductor photonic device substrate of an LED (Light Emitting Diode). A buffer layer 102, a DBR (Distributed Bragg Reflector) layer 103, an n-clad layer 104, an active layer 105, a p-clad layer 106, and a current diffusion layer 107 are stacked on a substrate 101.

The buffer layer 102 is a layer grown for improving the junction property of crystal with the upper DBR layer 103 at the time of successive crystal growth on the substrate 101. The DBR layer 103 is provided so that the light coming to the substrate side is reflected to the upper side of the LED, and it is made up by stacking two types of films different in composition and refractive index many times. The n-clad layer 104 is an n-type semiconductor for providing a function of a diode. It has also a function of adjusting the direction of light and improving the junction with the active layer 105, and a group-VI element such as Se and Te is doped thereto so as to give an n-type function. Note that the doping of the group-VI element is carried out also to the DBR layer 103 and the buffer layer 102 to improve the electrical properties.

The active layer 105 is made up by stacking two types of extremely thin layers different in composition and electron energy of a conduction band and a valence band (barrier layer and well layer) many times. This forms the MQW (Multiple Quantum Well) and achieves the strong light emission at a specific wavelength (color). The p-clad layer 106 is a p-type semiconductor for providing a function of a diode, and also has the similar function to the n-clad layer 104. The current diffusion layer 107 is provided so as to adjust the current flow and has a large thickness. A group-II element such as Mg is doped into the p-clad layer 106 and the current diffusion layer 107. By applying a voltage to this laminated structure while setting a high electric potential (high potential 111) to an upper side and a low electric potential (low potential 112) to a lower side, the light emission occurs in the active layer 105 and a light 121 is taken out upward.

This semiconductor photonic device substrate is fabricated by the successive crystal growth in one chamber of the MOCVD equipment through a single operation. FIG. 2 shows the structure of the chamber of the MOCVD equipment. The substrate 203 with its front surface directed downward (opposing plate 207 side) is held by a susceptor 201. Several to several tens of substrates 203 can be arranged on the susceptor 201. A soaking plate 202 for preventing the temperature nonuniformity is disposed on the back surface side of the substrate 203. In order to equalize the growth rate in the plane of the substrate 203, the susceptor 201 and the substrate 203 are individually rotated at the time of the crystal growth. The temperature is controlled by a heater 206 so as to promote the crystal growth on the surface of the substrate 203, and the several types of source gas 204 are introduced in the chamber while controlling the flow rate. By this means, crystals with specific compositions are grown.

The source gas 204 includes TMG (Trimethyl Gallium: $(CH_3)_3$—Ga), TMA (Trimethyl Aluminum) and TMI (Trimethyl Indium) for introducing the group-III element, $NH_3$, $PH_3$ and $AsH_3$ for introducing the group-V element, and $H_2Se$ and $Cp_2Mg$ (Cyclopentadienyl Magnesium) as a dopant material. In addition, carrier gas for obtaining a predetermined flow rate is also used.

For example, Japanese Patent Application Laid-Open Publication No. 2007-246341 (Patent Document 1) shows an example of a manufacturing method of an LED semiconductor photonic device substrate. As an example of the crystal growth by the metal organic vapor phase epitaxy (MOVPE) method, the fifth embodiment of Patent Document 1 discloses the method in which an n-type contact layer, an electro-static protection layer, a doped semiconductor layer 1, a doped semiconductor layer 2, a doped semiconductor layer 3, an n-clad layer, an MQW active layer, a p-clad layer and a p-type contact layer are successively crystal-grown on a substrate while controlling growth conditions such as temperature, source gas and its flow rate. In each of the layers, a plurality of layers are crystal-grown while adjusting conditions more finely. Also, it includes the descriptions about the crystal growth of predetermined thicknesses for all of the layers, and therefore, the growth time has to be set as a growth condition. Fourteen types of layer compositions are provided in total. Note that, since the MQW has a repetitive multi-layer structure, the detailed number of layers reaches several tens of layers.

In the mass production of the semiconductor photonic device substrate, the process is repeated in a manner such that a set of substrates including several to ten and several substrates is processed at once and then a next set of substrates is processed. When repeating the process several tens of times, reactants are attached inside the chamber, so that the quality of the fabricated photonic device substrates does not satisfy the control standard. Therefore, maintenance such as the cleaning of the inside of the chamber and the part replacement is carried out. After the maintenance, the chamber state changes due to the individual variability of the members that make up the chamber and the variation in setting and cleaning, and therefore, the growth conditions have to be checked in order to obtain the predetermined composition and film thickness. More specifically, the check of the composition by the photoluminescence emission and the growth rate preinspection for obtaining the growth time of each layer are carried out.

In the semiconductor photonic device substrate, crystal growth of a large number of layers is successively performed, and since the multiple layers are provided and they have significantly different thicknesses, it is difficult to measure the thickness of the semiconductor photonic device substrate in a non-destructive manner. Therefore, crystal growth is carried out individually for only a predetermined time by using an individual substrate for each composition and the film thickness is measured, thereby obtaining the growth rate. Accordingly, the growth rate preinspection has to be carried out several tens of times in each maintenance.

Further, Japanese Patent Application Laid-Open Publication No. 2000-53494 (Patent Document 2) shows that the film stack is deposited at once and the thickness of each layer is obtained by one measurement (X-ray reflectometry), thereby obtaining the growth rate. In this measurement method, however, the X-ray reflectometry apparatus is required, and the number of types of the stacked films (two types of GaAs and AlGaAs in the embodiment) and the film thickness (20 to 40 nm in the embodiment) are assumed to have a physical limit due to the interference in the reflectometry. Due to these problems, the method of Patent Document 2 is not suitable for the film thickness measurement of the multiple-material/multiple-layer stacked films having different thicknesses.

The semiconductor wafer of an LSI product also becomes a product by stacking multi-layer films. For example, Japanese Patent Application Laid-Open Publication No. 2008-117887 (Patent Document 3) describes a film stack structure using a low-k material as an insulating film. A manufacturing method of a semiconductor device in which two types of oxide films are stacked as insulating films and copper (Cu) is embedded through photolithography and etching is shown. Although the LSI semiconductor wafer is fabricated by repeating this manufacturing method several to ten and several times, the film formation, photolithography and etching are carried out by respectively different equipments. Further, the two types of oxide films are formed by the coating method and the CVD method, respectively, and are formed by different equipments. Therefore, the preinspection of the film-formation rate is carried out for each layer (in each equipment), and the film-formation rate is not estimated by using the preinspection results of the other layer and other equipment. Deposition of an oxide film made of TEOS material and film deposition of a gate structure such as polysilicon, WSi (tungsten silicon) and SiN (silicon nitride) are also carried out in addition to the low-k material, but the process of successively forming the films of the multilayer structure like that of the compound semiconductor photonic device substrate is not carried out.

SUMMARY OF THE INVENTION

The present invention has been created for the purpose of solving the problem of a large number of preinspection operations caused because multi-layer films are successively crystal-grown in the same chamber like in the process of the semiconductor photonic device substrate in the MOCVD equipment and growth rate preinspections of the films with various compositions have to be carried out after maintenance.

The items of the preinspection carried out before the start of the manufacture of the semiconductor photonic device substrate after maintenance in the MOCVD equipment are shown in FIG. 3 in the order of operations. First, equipment availability check (pre-conditioning interim operation) 301 is carried out. After checking that there is no abnormality in the equipment operation, the temperature, which is an important setting value in the crystal growth, is checked by actually performing a crystal growth on a substrate (temperature check (growth rate check) 302). The growth rate can also be checked by measuring the film thickness. Next, flow rate preinspections 303, 304 and 305 for checking the flow rate for obtaining the predetermined compositions are carried out to the combination of the film compositions. With respect to the compositions, a plurality of combined compositions such as composition of Ga and As, composition of Ga and P and composition of In and P are involved, and therefore, the preinspection operations in accordance with the combination are carried out.

Thereafter, the growth rate preinspections 306 to 314 are repeated for the nine composition films. In each of the growth rate preinspections, the substrate is placed in the chamber to start the process, and after waiting until reaching a predetermined temperature, the gas material is supplied to perform the crystal growth for a predetermined time, and then the end process is carried out. In this manner, a series of processes are all necessary. Therefore, the preinspection is a time-taking operation. By measuring the film thickness of the processed substrate and dividing the measured value by the crystal growth time, the growth rate can be checked.

The crystal growth time of the active layer and the DBR layer is determined based on the growth rate obtained in the preinspection, and then the active layer emission preinspection 315 and the DBR layer reflection preinspection 316 are carried out. The emission wavelength and the emission intensity are measured after carrying out the crystal growth of a plurality of layers on the substrate, respectively, and it is checked whether the predetermined light emission can be obtained. Finally, the equipment pre-conditioning interim operation before mass production 317 is carried out.

An object of the present invention is to reduce this large number of items of the growth rate preinspection in the preinspection operation.

The growth rate preinspection is carried out for the films corresponding to the compositions of each layer of the semiconductor photonic substrate, but the gas materials are limited to group-III elements such as Ga and In and group-V elements such as As and P and some composition components are common to each of the layers. Therefore, the growth rate preinspection is carried out for films corresponding to apart of layers, and the growth rate of other films is estimated by using the growth rate actual result value obtained as a result of the preinspection. By this means, the growth rate preinspection can be reduced.

When the growth rate is estimated based on the result of the growth rate preinspection of only one film, there is fear that the accuracy is degraded due to the variation in the preinspection operations. For its prevention, the growth rate is estimated by using the result of the growth rate preinspection of plural films so as to ensure the estimation accuracy.

When the growth rate of a certain film is estimated from a growth rate actual result value of another film, this estimation can be carried out based on an inter-layer growth rate model obtained by defining, as an expression, the relationship between the growth rate of a film to be estimated serving as an output and the growth rate actual result value serving as an input.

When parameters (coefficient, intercept) of the inter-layer growth rate model are to be determined, the parameters have to be calculated by a method such as the multiple regression analysis. Therefore, actual result samples of the growth rate are necessary. For example, assuming that the maintenance is performed once a month, it takes six months to take six actual result samples. In such a case, it takes a long time before the growth rate can be estimated from when new equipment is introduced, when anew type of component is introduced in the chamber, when composition of a film is changed, and when growth conditions such as temperature and pressure are changed. Therefore, another object of the present invention is to estimate the growth rate as early as possible.

For its achievement, the inter-layer growth rate model is recursively obtained in each growth rate preinspection after the maintenance. Some models (combination of layers and calculation of parameter) are prepared by combining the growth rate preinspection and the growth rate preinspection result performed before, and it is determined whether the accuracy satisfies the permissible value. When the accuracy satisfies the permissible value, the growth rate is estimated based on the model in the following maintenance, thereby reducing the preinspection operations.

Furthermore, by using PLS (Partial Least Square or Projection to Latent Structure) regression analysis, the parameters can be calculated even when the number of actual result samples is smaller than the number of input items (variable of the expression). Therefore, the preinspection operation can be further reduced.

The above and other objects and novel characteristics of the present invention will be apparent from the description of the present specification and the accompanying drawings.

The typical ones of the inventions disclosed in the present application will be briefly described as follows.

For the achievement of the above-described objects, in the manufacturing scene of the semiconductor photonic device substrate, the MOCVD equipment and the film thickness measurement apparatus for measuring the film thickness are provided and have to be activated. The MOCVD equipment is connected to a storage medium and has means for storing data of growth conditions such as pressure, temperature, flow rate of source gas and growth time to the storage medium. Further, the film thickness measurement apparatus is also connected to the storage medium and has means for storing film thickness data to the storage medium. A calculator is connected to the storage medium and has means for acquiring and storing data from and to the storage medium. The calculator is provided with means for estimating a growth rate, means for obtaining a growth time of each layer of the semiconductor photonic device substrate and means for calculating parameters (coefficient, intercept) of inter-layer growth rate model for estimating the growth rate.

For estimating the growth rate of the film corresponding to some layers of all of the layers of the semiconductor photonic device substrate, means for acquiring the growth time and film thickness measurement result in the growth rate preinspection for the film corresponding to the layer other than the layer to be estimated is provided, and also, means for calculating the growth rate based on the inter-layer growth rate model is provided.

For obtaining the growth time of each layer of the semiconductor photonic device substrate, means for acquiring a film thickness standard (reference film thickness) of each layer of the semiconductor photonic device substrate to be a product is provided, means for acquiring the growth rate of the film corresponding to the composition of each layer is provided, and also, means for calculating the growth time based on the film thickness standard and the growth rate is provided.

For determining the inter-layer growth rate model required for estimating the growth rate, means for specifying the combination of the films of the compositions to be the input and output of the model is provided. The combination of the films can be determined from the correlation of the growth rate actual result samples. In this manner, candidates of the inter-layer growth rate model actually used for the growth rate estimation can be defined. For calculating the parameters of various types of inter-layer growth rate models in accordance with the combinations of the films of the input and output, for example, means for acquiring the growth rate actual result samples during the period after the introduction of new equipment and the period when the composition of the films of the semiconductor photonic device substrate and growth conditions such as temperature and pressure are not changed is provided, means for specifying a method of regression calculation such as the multiple regression analysis and the PLS regression analysis is provided, and means for calculating the parameters by the various regression calculations from the actual result samples is provided. Since means for estimating the growth rate of the film to be the output from each actual result sample is provided, means for obtaining an error between the actual result value and the estimated value is provided, and means for comparing the errors of the inter-layer growth rate models for the combinations of the films of the input and output is provided, the inter-layer growth rate model actually used for the growth rate estimation can be selected.

The effects obtained by typical embodiments of the present invention disclosed in this application will be briefly described below.

According to the present invention, in the crystal growth of the multilayer semiconductor photonic device substrate by the MOCVD equipment, the growth rate of only a part of films out of the films corresponding to all types of compositions is checked by the preinspection operation, and the growth rate of the other films can be obtained by estimation. Therefore, the preinspection operation can be reduced. More specifically, the number of operation steps and the gas material can be reduced, and the duration of use of consumable parts in the chamber can be extended. Further, since the time required for the preinspection operation can be shortened, the production of the semiconductor photonic device substrate can be accordingly performed for the shortened time, so that the amount of production of the semiconductor photonic device substrate per unit period can be increased.

Further, since the estimation accuracy of the growth rate can be ensured by use of the growth rates of a plurality of films, the variation in film thickness of the respective layers of the semiconductor photonic device substrate can be suppressed within the permissible range, and the high quality can be ensured.

The parameters (coefficient, intercept) of the inter-layer growth rate model to be used for the growth rate estimation of each film are obtained by use of the actual result samples. Since it takes time to accumulate the actual result samples, candidates of the inter-layer growth rate model are set in advance in accordance with the input and output combination of the various types of films, and when the growth rate preinspection in each maintenance is completed, the parameter of each model is recursively estimated, and the model with the highest estimation accuracy is selected. By this means, the inter-layer growth rate model and its parameter can be determined with a small number of actual result samples while ensuring the high growth rate estimation accuracy. Since the growth rate can be estimated in the next and following maintenances after the determination, the growth rate preinspection operation can be reduced early.

Furthermore, when the parameter of the inter-layer growth rate model using various types of films as the input is to be obtained, the PLS regression analysis is used. Therefore, the parameter can be calculated with a smaller number of actual result samples than the number of inputs while ensuring the estimation accuracy based on the correlation in growth rate between respective films. More specifically, the inter-layer growth rate model and its parameter can be determined with a smaller number of actual result samples than that of the case using the multiple regression analysis in which actual result samples more than the number of inputs are required, and the growth rate preinspection operation can be reduced early.

BRIEF DESCRIPTIONS OF THE DRAWINGS

FIG. 3 is an explanatory diagram showing the procedure of the preinspection for the crystal growth of the semiconductor photonic device substrate after the maintenance in the conventional MOCVD equipment;

FIG. 7 is a diagram showing the correlation matrix of the growth rate of each film (MOCVD equipment A) which corresponds to the result of growth rate preinspection in each maintenance according to the first embodiment of the present invention;

FIG. 8 is a diagram showing the correlation matrix of the growth rate of each film (MOCVD equipment B) which corresponds to the result of growth rate preinspection in each maintenance according to the first embodiment of the present invention;

Figure 9:
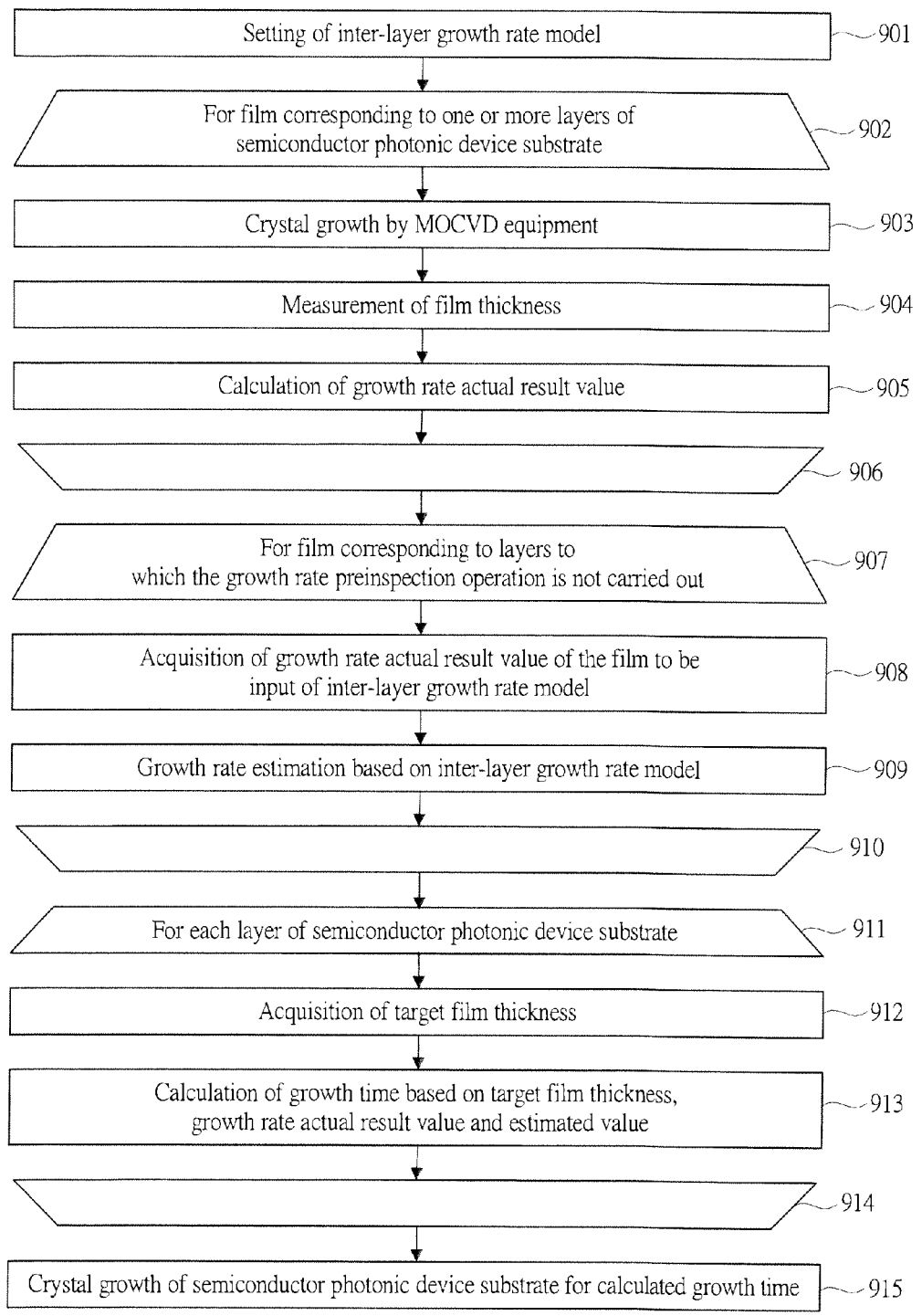
Figure 10:
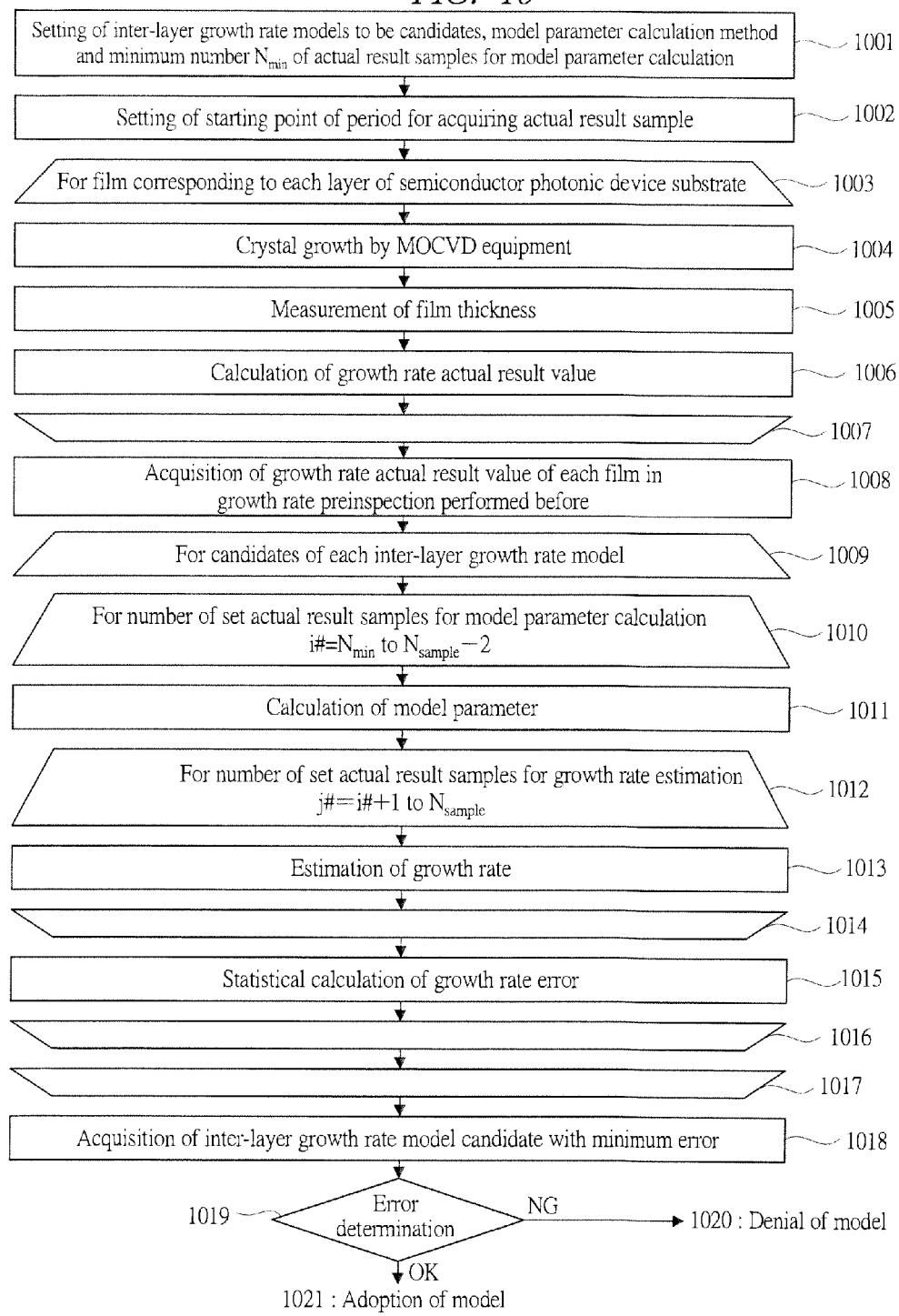

FIG. 9 is a diagram showing the flowchart for estimating the growth rate based on the inter-layer growth rate model and then obtaining the growth time of all layers of the semiconductor photonic device substrate according to the second embodiment of the present invention; and FIG. 10 is a diagram showing the flowchart for setting a plurality of candidates of the inter-layer growth rate model in advance and then determining the inter-layer growth rate model based on the growth rate actual result value.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

<Outline of Embodiment>

Figure 1:
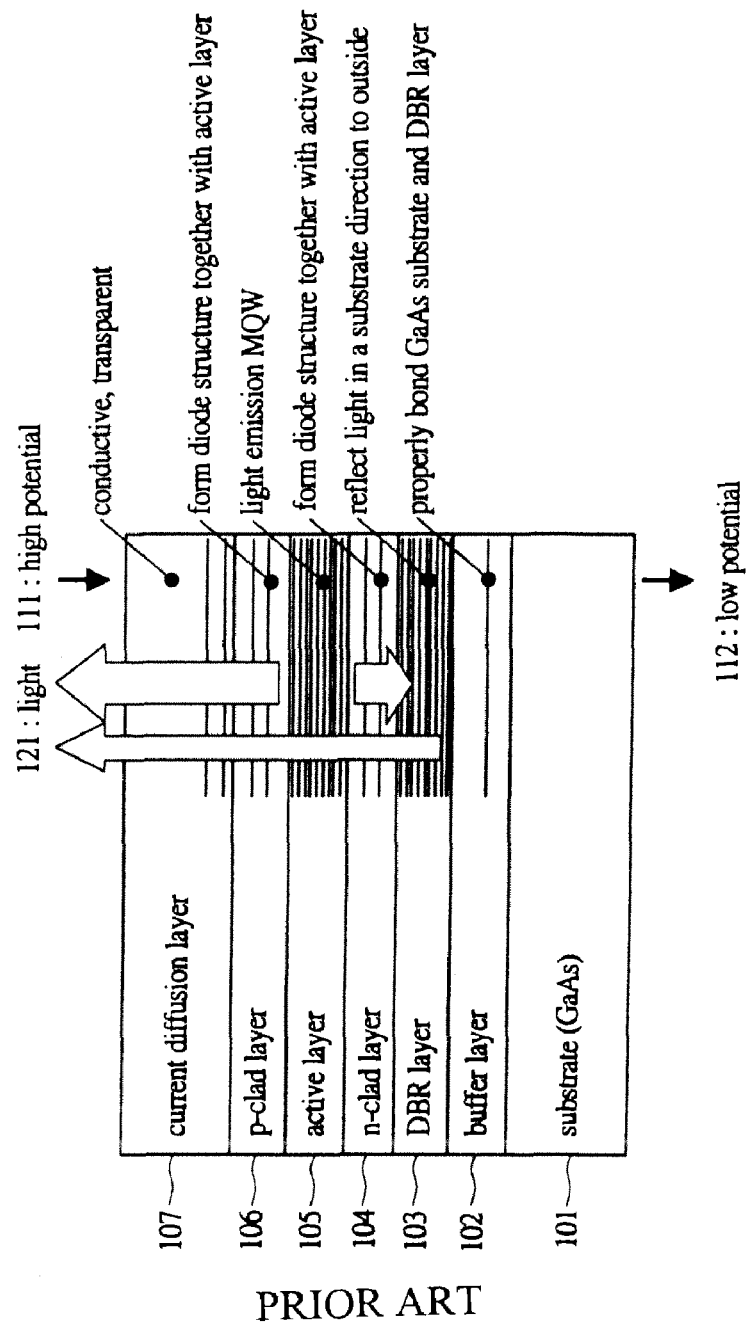
FIG. 1 is an explanatory diagram showing a cross section of a semiconductor photonic device substrate of a conventional LED.
Figure 2:
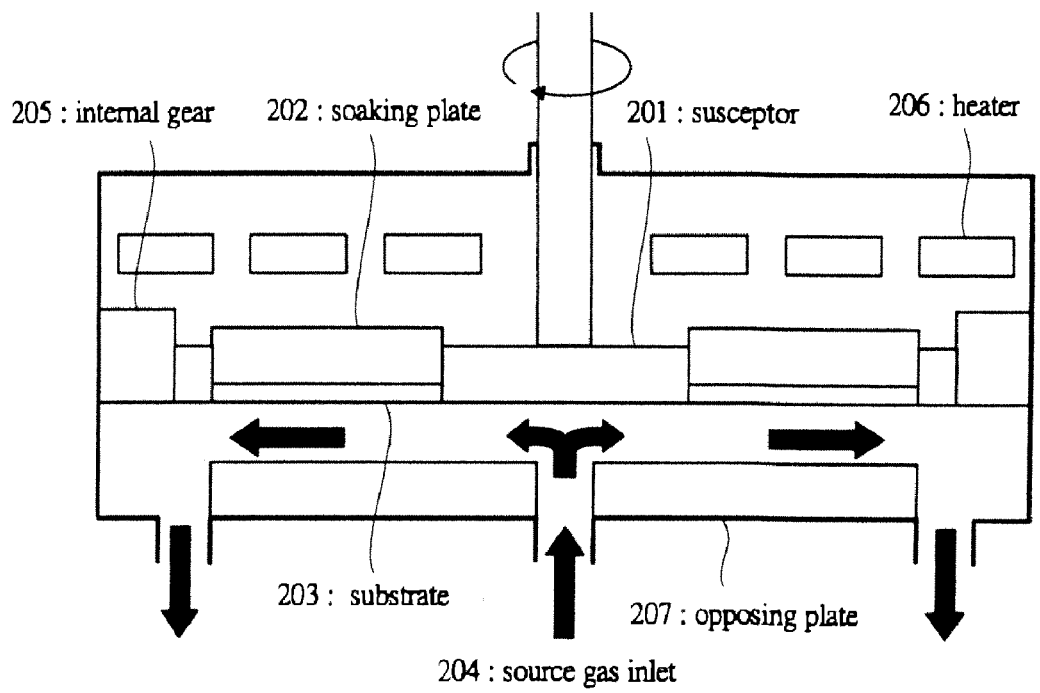
FIG. 2 is an explanatory diagram showing a structure of a chamber in a conventional MOCVD equipment.
Figure 4:
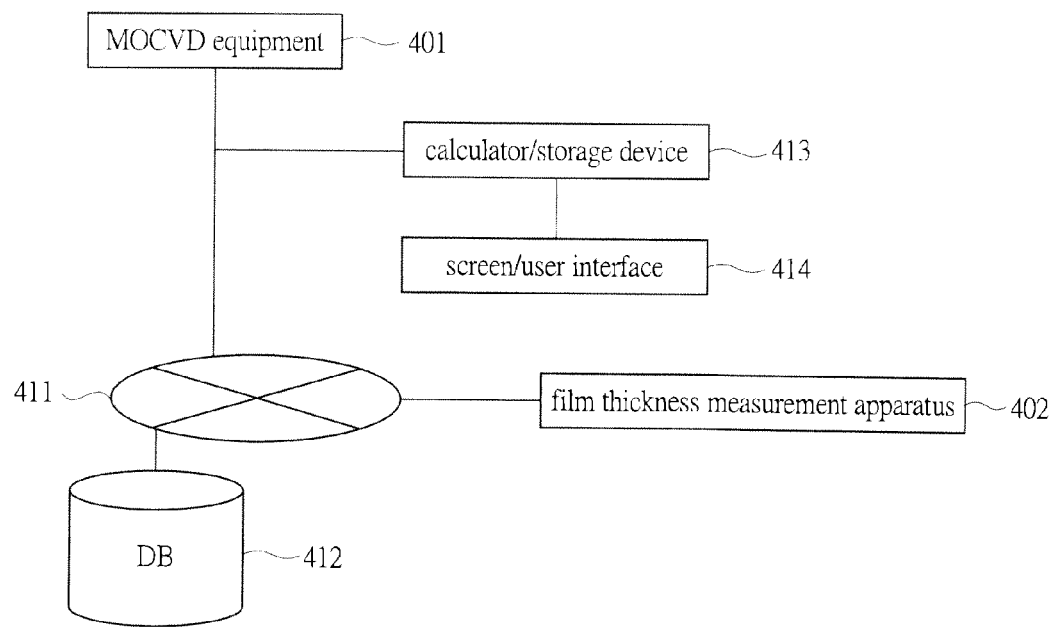
FIG. 4 is an explanatory diagram showing an example of an equipment configuration of a semiconductor photonic device substrate manufacturing system according to an embodiment of the present invention.
Figure 5:
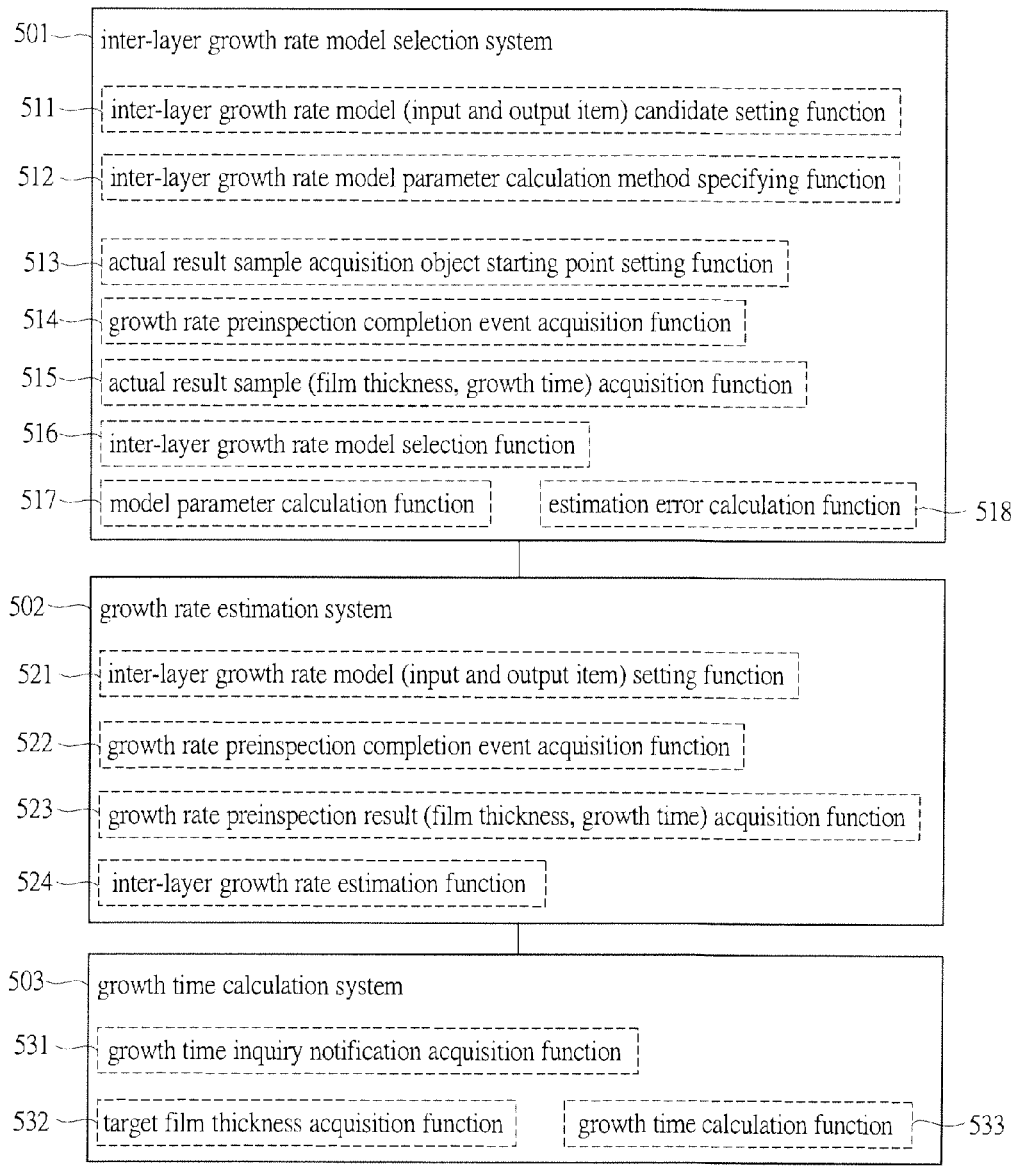
FIG. 5 is a diagram showing an example of a functional structure of the semiconductor photonic device substrate manufacturing system according to an embodiment of the present invention.

For the description of the embodiments of the present invention, FIG. 4 shows an example of an equipment configuration of a semiconductor photonic device substrate manufacturing system in the embodiments, and FIG. 5 shows an example of a functional structure of the semiconductor photonic device substrate manufacturing system.

An example of the equipment configuration of a semiconductor photonic device substrate manufacturing system will be described with reference to FIG. 4. The equipment configuration includes an MOCVD equipment 401, a film thickness measurement apparatus 402, a network 411, a database (DB) 412, a calculator/storage device 413, a screen/user interface 414 and others. In this equipment configuration, the so-called computer system executing arithmetic processing based on each information is made up of the network 411, the DB 412, the calculator/storage device 413, the screen/user interface 414 and others.

The MOCVD equipment 401 and the film thickness measurement apparatus 402 are installed so as to fabricate a semiconductor photonic device substrate and measure a film thickness, respectively, and are connected to the network 411 so as to exchange data. The database (DB) 412 is connected to the network 411, and a film formation time for the crystal growth in the MOCVD equipment 401 and a film thickness measurement result in the film thickness measurement apparatus 402 can be stored and accumulated in the database 412. Further, information for managing the actual results of the growth rate preinspection, for example, a point of time when the growth rate preinspection is carried out, a type and composition of a film, a name of a corresponding layer, and growth conditions such as temperature, source gas and its flow rate is registered in the DB 412.

Further, the computer/storage device 413 is connected to the network 411 and can exchange data with the DB 412 and the MOCVD equipment 401. In the calculator/storage device 413, the growth rate is estimated, and also the inter-layer growth rate model and its parameter are determined. The screen/user interface 414 is provided for the calculator/storage device 413 so as to make various settings.

With this configuration, in the growth rate preinspection before the fabrication of the semiconductor photonic device substrate, the growth rate preinspection of the film corresponding to some layers out of all of the layers whose growth rate has to be obtained is carried out, and the actual result values of the growth time and the film thickness are stored in the DB 412. Then, the actual result value stored in the DB 412 is acquired by the calculator/storage device 413 and the film thickness is divided by the growth time to obtain the growth rate. By this means, the growth rate of the films corresponding to other remaining layers can be estimated based on the inter-layer growth rate model. By referring to the target film thickness (standard value) of each layer of the semiconductor photonic device substrate, the growth time of each layer of the semiconductor photonic device substrate can be calculated from the growth rate obtained based on the growth rate actual result value and the estimation. The film thickness of each layer of the semiconductor photonic device substrate is stored in the DB 412 as the standard value or the management value.

Also, in the stage where the growth rate is obtained from the actual result value in the growth rate preinspection without obtaining the growth rate by the estimation, the preinspection actual result values of all layers are stored in the DB 412 in each preinspection, thereby accumulating the actual result values. For the determination of the inter-layer growth rate model and its parameter, the growth time in the growth rate preinspection and the actual result value of the film thickness accumulated in the DB 412 are acquired by the calculator/storage device 413, and the actual result value of the growth rate is calculated. The parameter of the inter-layer growth rate model using the growth rate of the films corresponding to various types of layers as input and output is calculated by the regression calculation using a part of the growth rate actual result values out of all of the actual result values. By estimating the growth rate by use of remaining growth rate actual result values and evaluating the error from the growth rate actual result value of the film to be estimated, the inter-layer growth rate model and its parameter that minimize the error can be determined.

Functions required in the processing will be described based on the example of the functional structure of the semiconductor photonic device substrate manufacturing system in FIG. 5. The functional structure is established with software by programs on the computer system made up of the calculator/storage device 413 and others and includes an inter-layer growth rate model selection system 501, a growth rate estimation system 502, a growth time calculation system 503 and others, and each function is included in each of the systems.

The inter-layer growth rate model is determined by the inter-layer growth rate model selection system 501. First, a combination of films corresponding to various types of layers to be an input and an output is set by an inter-layer growth rate model (input and output item) candidate setting function 511. Also, a method of regression calculation for calculating the parameter such as the single regression analysis, the multiple regression analysis and the PLS regression analysis is specified by an inter-layer growth rate model parameter calculation method specifying function 512. In order to obtain the inter-layer growth rate model from the actual result values, the actual result values in the period when the composition and growth condition of the films of the semiconductor photonic device substrate are not changed have to be collected. Therefore, the starting point of this period is specified by an actual result sample acquisition object starting point setting function 513. Then, a notification of the time point when the growth rate preinspection operation is completed in the MOCVD equipment 401 is received by a growth rate preinspection completion event acquisition function 514, and this time point is defined as an end point of the period.

Then, the growth rate preinspection actual result values in the period from the starting point to the end point are acquired from the DB 412 by an actual result sample (film thickness, growth time) acquisition function 515. Parameters of the inter-layer growth rate model in which combinations of various types of inputs to a specific output are set are calculated by a model parameter calculation function 517 by use of a part of all of the growth rate actual result values, the growth rate is estimated by use of the remaining growth rate actual results, and an error from the growth rate of the estimation target is obtained by an estimation error calculation function 518. Then, by specifying the combination having the smallest estimation error from among the combinations of various types of inputs to a specific output, the inter-layer growth rate model can be determined.

Next, the function of the growth rate estimation system 502 will be described. First, the combination of films to be an input and an output of the inter-layer growth rate model and the model parameter are set by an inter-layer growth rate model (input and output item) setting function 521. It is also possible to directly set the model determined by the inter-layer growth rate model selection function 516 of the inter-layer growth rate model selection system 501. Then, a growth rate preinspection completion event acquisition function 522 receives the notification of the completion of the preinspection operation by the MOCVD equipment 401 and the film thickness measurement apparatus 402, and the film thickness and growth time actual result values are acquired from the DB 412 by a growth rate preinspection result (film thickness, growth time) acquisition function 523. By dividing the film thickness by the growth time by an inter-layer growth rate estimation function 524 to obtain the growth rate actual result value and using it as an input of the inter-layer growth rate model, the growth rate of the film to be an output can be estimated.

Finally, the function of the growth rate calculation system 503 will be described. Before starting the fabrication of the semiconductor photonic device substrate, the growth time of each layer has to be obtained. Therefore, an inquiry notification about the growth time of the semiconductor photonic device substrate to be fabricated in the MOCVD equipment 401 is issued from the screen/user interface 414. In the growth time calculation system 503, a growth time inquiry notification acquisition function 531 receives the notification and calculates the growth time. For the calculation, a target film thickness of each layer is acquired from the DB 412 by a target film thickness acquisition function 532. Then, the growth time is calculated by a growth time calculation function 533 by use of the growth rate actual result value and the estimated value. By responding to the growth time inquiry with the calculated growth time, the fabrication of the semiconductor photonic device substrate can be started in the MOCVD equipment 401.

Hereinafter, embodiments based on the above-described outline of the embodiment will be concretely described.

First Embodiment

The first embodiment will be described with reference to FIGS. 6, 7 and 8.

First, the feasibility of the estimation of a growth rate of a film corresponding to a certain layer based on a growth rate of a film corresponding to another layer will be described.

Figure 6:
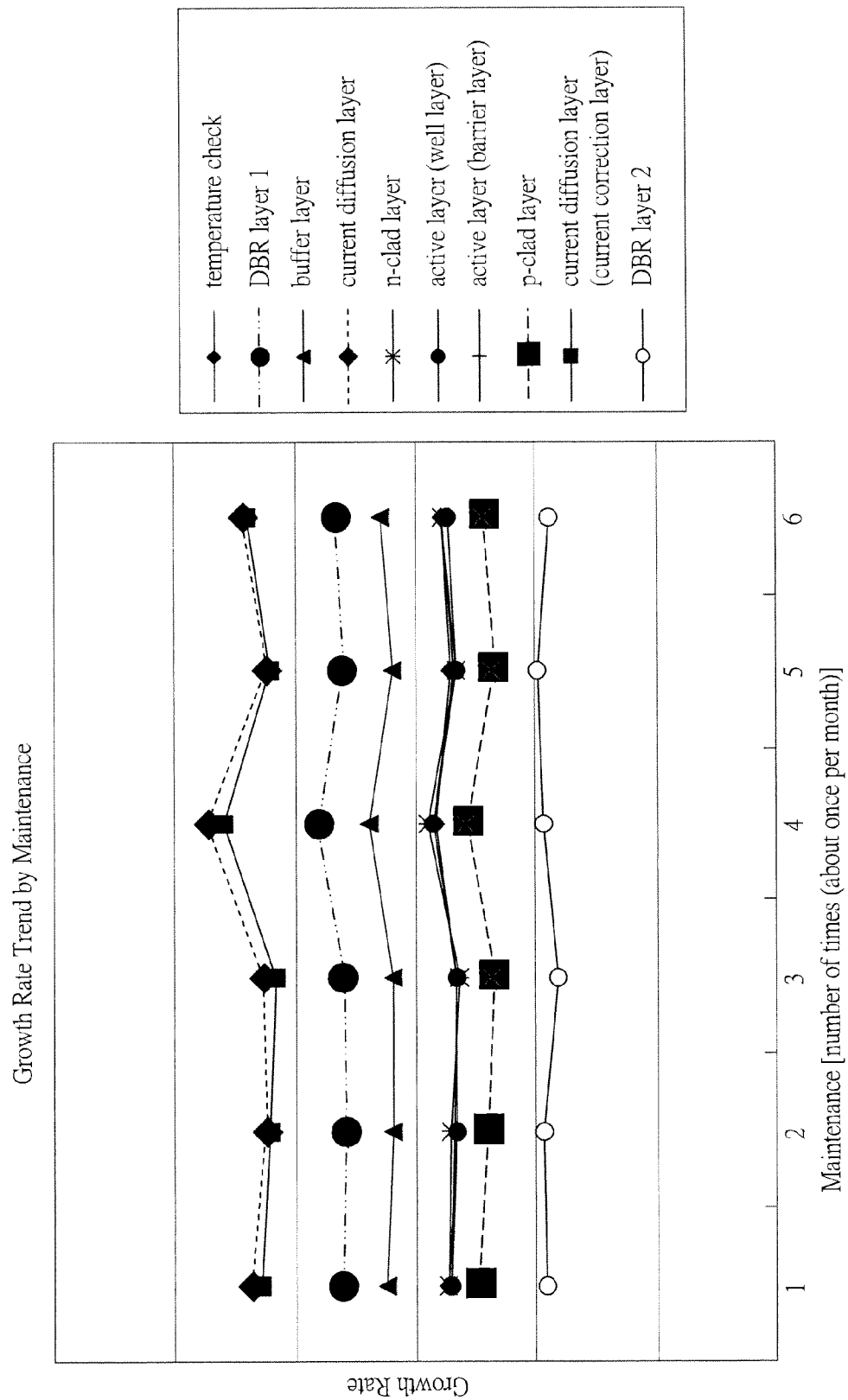
FIG. 6 is a diagram showing the growth rate trend which corresponds to the result of growth rate preinspection in each maintenance according to the first embodiment of the present invention.

FIG. 6 shows the growth rate trend by maintenance in an MOCVD equipment A. An x axis represents the maintenance [number of times (about once per month)], and a y axis represents the growth rate. A total of six growth rate preinspection results after the maintenances are shown. The growth rates of the films corresponding to the layers other than the DBR layer 2 change with the same trend of fall, rise, large rise, large fall and rise from the first growth rate to the sixth growth rate. In other words, the changing patterns of each maintenance have a correlation with each other.

So, FIG. 7 shows a correlation matrix using the six samples about the growth rates of all layers of the preinspection. It is possible to confirm that the growth rates of most of the layers have a high correlation with a correlation coefficient of 0.9 or more. The high correlation means that there is a proportional relation or a linear relation between the growth rate of a certain layer and the growth rate of another highly-correlated layer. Therefore, if the relation in the growth rate with the highly-correlated layer is formulated as the inter-layer growth rate model, the growth rate can be estimated by use of the actual growth rate preinspection operation result of the high-correlated layer based on the inter-layer growth rate model.

According to FIG. 7, by carrying out the preinspection of temperature check while setting 0.95 as the standard value (lower limit value) of the high correlation coefficient, the growth rates of the films corresponding to the DBR layer 1, the buffer layer, the current diffusion layer, the active layer (well layer), the active layer (barrier layer) and the current diffusion layer (current correction layer) can be estimated based on the inter-layer growth rate model. By this means, the actual growth rate preinspection operations for these layers can be reduced.

Next, FIG. 8 shows a correlation matrix of the growth rate in the growth rate preinspection after the maintenance for several months in an MOCVD equipment B different from the MOCVD A. The semiconductor photonic device substrate to be fabricated is the substrate of the same type as that fabricated by the MOCVD equipment A, but has different conditions such as temperature and flow rate. Also, the equipment itself is newer than the MOCVD equipment A, and the operation period for mass production thereof is shorter than that of the MOCVD equipment A.

Since there are five combinations having the inter-layer correlation coefficient of 0.9 or more in total, for example, the combination of the active layer (well layer) and the n-clad layer, the number of layers whose growth rate can be estimated is reduced. Also, since the values of the correlation coefficients are lower than those of FIG. 7, the estimation accuracy of the growth rate is lowered. Here, with respect to the composition of the films of each of the layers, the same gas materials are used and the ratio of the crystal mixture of materials such as Ga, In, P and As differs. Therefore, the attention is paid to the fact that the correlation in growth rate is established among a plurality of layers if the compositions thereof are close to each other. For example, the growth rate of the composition of GaInP is estimated by use of the growth rates of the composition of GaP and the composition of InP. In this manner, by estimating the growth rate of a film corresponding to another layer from a plurality of films, the number of films whose growth rates are to be estimated can be increased or the high accuracy can be ensured. This can be achieved by defining the inter-layer growth rate model using the growth rates of a plurality of films having relatively high correlation as inputs.

In FIG. 8, assuming that the growth rates of the layers with the correlation coefficient of 0.7 or more are referred, the growth rate of the current diffusion layer can be estimated by the temperature check and from the growth rate of the DBR layer 1, and the growth rate of the active layer (barrier layer) can be estimated from the growth rates of the DBR layer 1, the n-clad layer and the active layer (well layer). As described above, even if the estimation accuracy is low when the growth rate is estimated from the growth rate actual result value of one film, the estimation accuracy of the growth rate can be ensured by using the growth rate actual result values of a plurality of films even when the growth rate preinspection is replaced with estimation.

Second Embodiment

The second embodiment will be described with reference to FIG. 9.

The method of estimating the growth rate based on the inter-layer growth rate model by use of the growth rate preinspection results for a part of the films corresponding to the layers of the semiconductor photonic device substrate and then obtaining the growth time of all films corresponding to the layers is shown by the flowchart in FIG. 9.

The target of growth rate estimation will be described with using an example of the estimation based on the single-input single-output inter-layer growth rate model in which the growth rate of the current diffusion layer (current correction layer) is estimated from only the growth rate preinspection result of the temperature check (growth rate check) (hereinafter, referred to as estimation target example 1) and an example of the estimation based on the multiple-input single-output inter-layer growth rate model in which the growth rate of the active layer (barrier layer) is estimated from the growth rate preinspection results of the DBR layer 1, the n-clad layer and the active layer (well layer) (hereinafter, referred to as estimation target example 2).

First, the inter-layer growth rate model is set in advance (step 901). The inter-layer growth rate model is an expression having a growth rate of a film corresponding to a layer to be estimated as an output and a growth rate actual result value obtained from the growth rate preinspection operation as an input.

$$GR_i = c_0 + \sum_{j}^{n_{input}} c_j \times GR_j \qquad \text{[Expression 1]}$$

Here, GR stands for the growth rate, c stands for a coefficient, and i and j are indexes for the film corresponding to the layer. Also, $c_0$ is the intercept, and when the intercept is not introduced into the model, this value is fixed to 0. Further, $n_{input}$ stands for the number of growth rates to be input. Note that, although the inter-layer growth rate model is defined by a linear polynominal here, it is also possible to define the model by a non-linear polynominal to which a higher-order term and terms such as an exponent and a logarithm are introduced.

When the growth rate is automatically estimated by the system, the films corresponding to the layers of an input and an output are registered, and values of a coefficient and an intercept corresponding to the input are registered. In the estimation target example 1, "temperature check (growth rate check)" is set as an input and "current diffusion layer (current correction layer)" is set as an output, and the intercept $c_0$ and the coefficient $c_{temperature\ check}$ are set. The inter-layer growth rate model is as follows.

$$GR_{current\ diffusion\ layer} = c_0 + c_{temperature\ check} \times GR_{temperature\ check} \qquad \text{[Expression 2]}$$

In the estimation target example 2, "DBR layer 1", "n-clad layer" and "active layer (well layer)" are set as inputs and "active layer (barrier layer)" is set as an output, and then the coefficient and the intercept are set. The inter-layer growth rate model is as follows.

$$GR_{barrier\ layer} = c_0 + c_{DBR\ layer\ 1} \times GR_{DBR\ layer\ 1} + c_{n-clad\ layer} \times GR_{n-clad\ layer} + c_{well\ layer} \times GR_{well\ layer} \qquad \text{[Expression 3]}$$

In the fabrication of the semiconductor photonic device substrate in the MOCVD equipment, the growth rate preinspection is carried out after the maintenance of the MOCVD equipment is performed. At this time, the growth rate preinspection is carried out for the films corresponding to one or more layers of the semiconductor photonic device substrate (steps 902 to 906). In the growth rate preinspection operation, first, the crystal growth is carried out in the MOCVD equipment (step 903), the film thickness is measured by the film thickness measurement apparatus after the crystal growth (step 904), and the growth rate actual result value is calculated (step 905). The crystal growth time in the MOCVD equipment and the film thickness value in the film thickness measurement apparatus are stored in the database, and the notification of the completion of the film thickness measurement is sent to the calculator by the film thickness measurement apparatus, thereby calculating the growth rate actual result value in the calculator. Note that the growth rate can be obtained by dividing the film thickness by the growth time. The calculated growth rate actual result value is stored in the storage device or the database.

In the estimation target example 1, the growth rate preinspection of the temperature check (growth rate check) has to be carried out. Also, in the estimation target example 2, the growth rate preinspection for the three films corresponding to the DBR layer 1, the n-clad layer and the active layer (well layer) has to be individually carried out.

Next, for the films corresponding to the remaining layers to which the growth rate preinspection operation (steps 902 to 906) is not carried out (steps 907 to 910), the growth rate is estimated based on the inter-layer growth rate model. With reference to the setting of the inter-layer growth rate model, the growth rate actual result value of the film to be an input is acquired (step 908). Then, the actual result value is substituted for each item of the right-hand member of the inter-layer growth rate model, thereby estimating the growth rate of the target film (step 909).

In the estimation target example 1, the growth rate actual result value of the temperature check (growth rate check) preinspection result is acquired to estimate the growth rate of the film corresponding to the current diffusion layer (current correction layer). Also, in the estimation target example 2, all of the growth rate actual result values of the preinspection results for the DBR layer 1, the n-clad layer and the active layer (well layer) are acquired to estimate the growth rate of the film corresponding to the active layer (barrier layer).

Then, the growth time for each layer of the semiconductor photonic device substrate is calculated by use of the obtained growth rate actual result value and estimated value of each film (steps 911 to 914). First, the target film thickness of the layer (standard value of the film thickness) is acquired from the database (step 912). For the automation of the calculation process, the target film thickness has to be previously stored in the database as the standard information of the semiconductor photonic device substrate, but the target film thickness may be set from the user interface of the calculator. The growth time is calculated by dividing the target film thickness by the growth rate actual result value or the growth rate estimated value of the film corresponding to the layer.

Thereafter, the crystal growth of the semiconductor photonic device substrate is performed for the calculated growth time (step 915). In this manner, instead of carrying out the growth rate preinspection operation of the films corresponding to all of the layers of the semiconductor photonic device substrate, by carrying out the growth rate preinspection operation of only a part of the films, the growth rate of all films can be obtained and the growth time of all layers can be determined.

The above is the description of the method of obtaining the growth time of all layers of the semiconductor photonic device substrate according to the present embodiment.

Third Embodiment

The third embodiment will be described with reference to FIG. 10.

The method of obtaining the inter-layer growth rate model, in which the error of the growth rate estimated value to the actual result value is minimized, from the candidates of various inter-layer growth rate models by using the past growth rate actual result values in each growth rate preinspection performed after the maintenance will be described.

For the estimation of the growth rate, the parameter of the inter-layer growth rate model is obtained by using the growth rate actual result values of the films to be an input and an output. And so, the method of calculating the parameter of the inter-layer growth rate model will be first described.

In the case of the single-input single-output inter-layer growth rate model, in particular, in the case where the model is defined by the proportional relation, the parameter can be estimated if there are one or more actual result samples of the growth rate preinspection. The parameter of the model expression (4) can be calculated by the expression (5).

$$GR_{output} = c_{layer1} \times GR_{layer1} \quad \text{[Expression 4]}$$

$$c_{layer1} = \frac{\sum_{i\#=1}^{N_{sample}} GR_{layer1}[i\#] \times GR_{output}[i\#]}{\sum_{i\#=1}^{N_{sample}} GR_{layer1}[i\#]^2} \quad \text{[Expression 5]}$$

Here, the number of samples is $N_{sample}$, and $i\#$ stands for the index of the actual result sample.

In the single-input single-output inter-layer growth rate model, when the model is defined by the linear relation with an intercept $c_0$, the parameter can be calculated by the same calculation as the multiple-input single-output inter-layer growth rate model. For the single-input single-output inter-layer growth rate model expression (6) and the multiple-input single-output inter-layer growth rate model expression (7), the parameter can be calculated by the expression (8).

$$GR_{output} = c_0 + c_{layer1} \times GR_{layer1} \quad \text{[Expression 6]}$$

$$GR_{output} = c_0 + c_{layer1} \times GR_{layer1} + \Lambda + c_{layern} \times GR_{layern} \quad \text{[Expression 7]}$$

$$c = (X^T X)^{-1} X^T y \quad \text{[Expression 8]}$$

$$X = \begin{bmatrix} 1 & GR_{layer1}[0] & \Lambda & GR_{layern}[0] \\ 1 & GR_{layer1}[1] & \Lambda & GR_{layern}[1] \\ M & & O & \\ 1 & GR_{layer1}[N_{sample}] & & GR_{layern}[N_{sample}] \end{bmatrix} \quad \text{[Expression 9]}$$

$$y = [\, GR_{output}[0] \quad \Lambda \quad GR_{output}[N_{sample}] \,]^T \quad \text{[Expression 10]}$$

$$c = [\, c_0 \quad c_{layer1} \quad \Lambda \quad c_{layern} \,]^T \quad \text{[Expression 11]}$$

The calculation method of the model parameter by the expression (8) is referred to as the multiple regression analysis. When the intercept $c_0$ is not introduced to the multiple-input single-output model expression (7), the first row of the right-hand member of the expression (9) may be removed or the intercept $c_0$ may be removed from the expression (11).

In the case where there are a plurality of growth rates of the films to be the input of the inter-layer growth rate model, the number of actual result samples required for obtaining the parameter by the multiple regression analysis is "the number of growth rates of the films to be the input+1" when there is the intercept and is "the number of growth rates of the films to be the input" when there is no intercept. Since the actual result samples have some variations, when the number of the actual result samples is almost equal to the number of the films to be the input, it causes the excessive matching, and the estimation accuracy (prediction accuracy) of the target film to the growth rate of the new input is degraded. Therefore, a large number of samples are required, and in other words, it takes time before the growth rate can be estimated.

Here, when focusing on the fact that there is the correlation in growth rate between the films corresponding to each layer, the respective changes in growth rate between the layers have a consistent relation. More specifically, the principal component over the respective layers exists. As the method of obtaining the relation between a plurality of inputs and outputs through inner models corresponding to the number of principal components with using the principal component vector as loading (weighting factor), the PLS (Partial Least Square or Projection on Latent Structure) regression analysis is known. As the number of loadings of the inner models (number of inner models), 1 to the number of input items can be specified. When there is the high correlation between the items of the inputs in the principal component analysis, the change in output can be expressed with a small number of principal components, and similarly, with respect to the plurality of input and output items having the correlation, the good output estimation accuracy can be obtained even with a small number of inner models.

In the PLS regression analysis, the parameter of the model can be calculated if there are the actual result samples as many as the number of inner models. More specifically, when the number of inner models is 1, the parameter can be determined with one or more actual samples. Further, if it is apparent that there is the correlation between the input and output items, the parameter of the model can be calculated by reducing the number of inner models to eliminate the variations in the individual items. Accordingly, the parameter (coefficient) with good estimation accuracy (prediction accuracy) can be obtained even with a small number of actual result samples while preventing the excessive matching, and the high estimation accuracy can be ensured.

The PLS regression analysis is the method in which the relation of the input and output is obtained through the inner model. That is, the input x and the output y are obtained by multiplying the variable (score) of the inner model by the loading (weighting factor). Note that the input x and the output y are the vectors each having the elements of the number of input items and the elements of the number of output items.

$$x^T = TP^T \quad \text{[Expression 12]}$$

$$y^T = TBQ^T \quad \text{[Expression 13]}$$

$$T = [t_1 t_2 \Delta t_{n_{inner}}] \quad \text{[Expression 14]}$$

$$P = [p_1 p_2 \Delta p_{n_{inner}}] \quad \text{[Expression 15]}$$

$$Q = [q_1 q_2 \Delta q_{n_{inner}}] \quad \text{[Expression 16]}$$

$$B = \text{diag}\{b_1 b_2 \Delta b_{n_{inner}}\} \quad \text{[Expression 17]}$$

Here, T stands for the score, P stands for the loading to the input, Q stands for the loading to the output, and B stands for the inner model coefficient. Also, $n_{inner}$ is the number of inner models. The score, loading and inner model coefficient can be calculated by the nonlinear iterative partial least square (NIPALS) method using the actual result samples of the input and output. The expression (18) can be obtained by deleting the score T of the expression (12) and the expression (13).

$$y^T = x^T (P^T)^{-1} BQ^T \quad \text{[Expression 18]}$$

Since the loading P is the matrix of "(the number of input items)×(the number of inner variables)", the expression (18) is true when these numbers are equal. When the number of inner variables is made smaller than the number of input items and the loading and the inner model coefficient are obtained with a small number of actual result samples, the relation of the input and output is given by the expression (19).

$$y^T = x^T P (P^T P)^{-1} BQ^T \quad \text{[Expression 19]}$$

Since the loading and the inner model coefficient are the matrix made up of numerical values, the expression (18) and the expression (19) have the same form as the expression (7). Note that, as the inter-layer growth rate model, the output y is one variable, that is, scalar.

The above is the method of obtaining the parameter of the inter-layer growth rate model.

Next, the method in which a plurality of candidates of inter-layer growth rate models are set in advance and the inter-layer growth rate model is determined by using the growth rate preinspection result performed after the maintenance and the growth rate actual result values executed before will be described with reference to the flowchart in FIG. 10.

First, the inter-layer growth rate models to be candidates, the model parameter calculation method and the minimum number $N_{min}$ of the actual result samples for the model parameter calculation are set (step 1001). As the inter-layer growth rate model, the film to be an output, the film to be an input, and the presence of the intercept are set. As the model parameter calculation method, when there is only one growth rate of the film to be the input, the corresponding single regression analysis is specified, and when there are a plurality of growth rates of the films to be the input, the multiple regression analysis or the PLS regression analysis is specified. Note that, even when there is only one growth rate of the film to be the input, the multiple regression analysis or the PLS regression analysis may be specified if there is an intercept. As the minimum number of actual samples for the model parameter calculation, the number equal to or larger than the number of model parameters is set in the case of the single regression analysis and the multiple regression analysis, and the number equal to or larger than 1 is set in the case of the PLS regression analysis.

Next, the starting point of the period in which the composition and the growth condition of the film of a semiconductor photonic device substrate are not changed is set as the starting point of the period for acquiring the actual result sample (step 1002).

After the maintenance of the MOCVD equipment, before the start of the fabrication of the semiconductor photonic device substrate, the growth rate preinspection is carried out. The growth rate preinspection operation is carried out for the films corresponding to each layer of the semiconductor photonic device substrate (steps 1003 to 1007). Then, the crystal growth of each of the films is performed by the MOCVD equipment (step 1004), the film thickness is measured (step 1005) and the growth rate actual result value is calculated by dividing the film thickness by the growth time (step 1006).

At the time when the growth rate preinspection operation is completed, the process of determining the inter-layer growth rate model is executed. In order to calculate the model parameter and evaluate the error, the growth rate actual result value of each film in the growth rate preinspection performed before is acquired (step 1008). The actual result value in the period from the starting point set in the step 1002 to the present point is acquired.

For each of the set candidates of the inter-layer growth rate models, the model parameter is obtained, and the error between the estimated value and the actual result value is calculated (steps 1009 to 1017).

For the calculation of the parameter and the error of the inter-layer growth rate model, the process is performed to each of the samples from the minimum number $N_{min}$ of the actual result samples for the model parameter calculation set in the step 1001 to the number obtained by subtracting 2 from the number $N_{sample}$ of actual result samples acquired in the step 1008 (steps 1010 to 1016). Note that, when the number of acquired actual result samples is smaller than the number obtained by adding 1 to the minimum number $N_{min}$ of the actual result samples for the calculation of the model parameter (that is, $N_{min}$, +1), the process of the model parameter estimation and the error evaluation is interrupted.

First, the model parameter is calculated (step 1011).

Assuming that the model parameter is calculated by using the samples with the sample numbers of 1 to n, the actual result samples from the n+1-th sample to the $N_{sample}$-th sample are not used for the parameter calculation. Thus, the error between the estimated value and the actual result value can be evaluated by using the actual result values from the n+1-th actual result value to the $N_{sample}$-th actual result value not used for the parameter calculation. By this means, the error can be evaluated while reducing the influence of the excessive matching. The reason why the maximum number of the actual result samples for the model parameter calculation is set to $N_{sample}$-2 is that the variation in error (standard deviation) is calculated by the remaining two actual result samples not used for the parameter calculation. When the average of the error only is evaluated, the value to be subtracted may be 1.

Note that, if the influence of the excessive matching or others does not matter, in the calculation of the parameter and the error, the parameter may be calculated by using all of the acquired actual result samples, and then the error between the estimated value of the output by the calculated parameter and the actual result value may be obtained. By this means, the number of actual result samples for determining the model can be reduced, and the reduction of the growth rate preinspection operation can be promoted early.

After the calculation of the model parameter (step 1011), the growth rate is estimated for the actual result samples not used for the calculation of the model parameter (steps 1012 to 1014). In the growth rate estimation (step 1013), the growth rate actual result value of the film of the input is substituted into the model, thereby calculating the output.

Then, the error of the estimated growth rate to be the output to the actual result value is obtained to calculate the statistics (step 1015). It is only necessary to calculate the average value and the standard deviation.

By the above-described steps 1009 to 1017, a list of the growth rate error calculation results is created for the combinations of each inter-layer growth rate model and the actual result samples for the model parameter calculation. For example, when the number of acquired actual result samples is 5 and the model candidates are A (two input items; multiple regression analysis) and B (three input items; PLS regression analysis (the number of inner models is 1)), a list of the average of the growth rate errors and the standard deviation is created for five combinations such as the model candidate A (the number of samples for parameter calculation is 2), the model candidate A (the number of samples for parameter calculation is 3), the model candidate B (the number of samples for parameter calculation is 1), the model candidate B (the number of samples for parameter calculation is 2), and the model candidate B (the number of samples for parameter calculation is 3).

Then, the inter-layer growth rate model candidate in which the error is minimized is acquired from these combinations (step 1018). For the error evaluation mentioned here, calculation results such as the absolute value of average of errors, the standard deviation, and (absolute value of average of errors+3)×(standard deviation) can be used.

Finally, it is determined whether the size of the error is allowable in the actual fabrication (step 1019). It is only necessary to compare the size to the predetermined reference by using the calculation results such as the absolute value of average of errors and the standard deviation similarly to the step 1018. If the error is smaller (OK), the model is adopted (step 1021), and the inter-layer growth rate model is determined by the inter-layer growth rate model candidate and the calculated parameter. In the next and following growth rate preinspections, the growth rate of the film corresponding to the layer to be the output is estimated by the model, and the inter-layer growth rate preinspection operation is unnecessary. If the error is larger (NG), the model is denied (step 1020), and the determination process of the inter-layer growth rate model is executed again in the next growth rate preinspection.

The above is the description of the method in which a plurality of candidates of inter-layer growth rate models are set in advance and the inter-layer growth rate model is determined by using the growth rate preinspection result performed after the maintenance and the growth rate actual result values executed before.

The above is the contents of the process in the manufacturing method of the semiconductor photonic device substrate according to the present embodiment.

<Effects of Outline of Embodiment and First to Third Embodiments>

According to the outline of the embodiment and the first to third embodiments described above, the following effects can be obtained.

(1) In the crystal growth of the multilayer semiconductor photonic device substrate by the MOCVD equipment, the growth rate of only a part of films out of the films corresponding to all types of compositions is checked by the preinspection operation, and the growth rate of the other films can be obtained by estimation. Therefore, the preinspection operation can be reduced. More specifically, the number of operation steps and the gas material can be reduced, and the duration of use of consumable parts in the chamber can be extended. Further, since the time required for the preinspection operation can be shortened, the production of the semiconductor photonic device substrate can be accordingly performed for the shortened time, so that the amount of production of the semiconductor photonic device substrate per unit period can be increased.

(2) Further, since the estimation accuracy of the growth rate can be ensured by use of the growth rates of a plurality of films, the variation in film thickness of the respective layers of the semiconductor photonic device substrate can be suppressed within the permissible range, and the high quality can be ensured.

(3) The parameters (coefficient, intercept) of the inter-layer growth rate model to be used for the growth rate estimation of each film are obtained by use of the actual result samples. Since it takes time to accumulate the actual result samples, candidates of the inter-layer growth rate model are set in advance in accordance with the input and output combination of the various types of films, and when the growth rate preinspection in each maintenance is completed, the parameter of each model is recursively estimated, and the model with the highest estimation accuracy is selected. By this means, the inter-layer growth rate model and its parameter can be determined with a small number of actual result samples while ensuring the high growth rate estimation accuracy. Since the growth rate can be estimated in the next and following maintenances after the determination, the growth rate preinspection operation can be reduced early.

(4) When the parameter of the inter-layer growth rate model using various types of films as the input is to be obtained, the PLS regression analysis is used. Therefore, the parameter can be calculated with a smaller number of actual result samples than the number of inputs while ensuring the estimation accuracy based on the correlation in growth rate between respective films. More specifically, the inter-layer growth rate model and its parameter can be determined with a smaller number of actual result samples than that of the case using the multiple regression analysis in which actual result samples more than the number of inputs are required, and the growth rate preinspection operation can be reduced early.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to a manufacturing technique of a semiconductor photonic device such as an LED in which multi-layer thin films different in composition need to be crystal-grown on a substrate (wafer) by using an MOCVD equipment.

What is claimed is:

1. A manufacturing method of a semiconductor photonic device substrate using an MOCVD equipment,
    wherein, before multi-layer films different in material composition are successively and gradually crystal-grown in one chamber, a process comprising:
    a first step of defining, by statistical analysis, an inter-layer growth rate model showing a relation in growth rate between each layer as a linear relation;
    a second step of obtaining a growth rate of a film corresponding to at least one or more layers by actual crystal growth using an individual substrate;
    a third step of directly calculating a growth rate of a film corresponding to other layers from the growth rate obtained in the second step by using the inter-layer growth rate model; and
    a fourth step of calculating a growth time in accordance with a film thickness of each layer of the semiconductor photonic device substrate based on the growth rate actually obtained in the second step and the growth rate calculated in the third step is carried out by using a computer system connected to the MOCVD equipment, and through the process above a crystal growth of the semiconductor photonic device substrate is performed.

2. The manufacturing method of a semiconductor photonic device substrate according to claim 1,
    wherein the inter-layer growth rate model defined in the first step is a model showing a relation between the growth rate of the film corresponding to at least one or more layers and the growth rate of the film corresponding to other layers as a proportional relation or a linear relation with an intercept.

3. The manufacturing method of a semiconductor photonic device substrate according to claim 1,
    wherein the semiconductor photonic device substrate is made up of a buffer layer, a DBR layer, an n-clad layer, an active layer, a p-clad layer and a current diffusion layer which are crystal-grown on a base substrate, and
    in each of the layers, at least one or more layers having different material compositions are stacked.

4. The manufacturing method of a semiconductor photonic device substrate according to claim 1,
    wherein, in order to define the inter-layer growth rate model defined in the first step, a process comprising:
    an eleventh step of setting one or more inter-layer growth rate model candidates in advance;
    a twelfth step of obtaining a growth rate of each layer by actual crystal growth using an individual substrate;
    a thirteenth step of searching, from a database, an actual result value of a growth rate of a film corresponding to each layer which is actually crystal-grown by using an individual substrate over a plurality of past periods;
    a fourteenth step of calculating a coefficient of the inter-layer growth rate model set in the first step by using an actual result value in a part of a period from among the actual result values of the growth rates in a plurality of periods acquired in the second step and the third step;
    a fifteenth step of estimating a growth rate of a film corresponding to a layer to be a target of estimation in an inter-layer growth rate model by using a growth rate actual result value in a period not used for the calculation of the coefficient in the fourteenth step, and then obtaining an estimation error from the actual result value; and
    a sixteenth step of selecting an inter-layer growth rate model used for determining a growth time at an actual crystal growth of the semiconductor photonic device substrate from among the inter-layer growth rate model candidates based on an accuracy of the estimation error is performed to define the inter-layer growth rate model.

5. The manufacturing method of a semiconductor photonic device substrate according to claim 4,
    wherein the coefficient of the inter-layer growth rate model is calculated by a multiple regression analysis by using a plurality of actual result values in the fourteenth step of calculating the coefficient of the inter-layer growth rate model.

6. The manufacturing method of a semiconductor photonic device substrate according to claim 4,
    wherein the coefficient of the inter-layer growth rate model is calculated by a PLS regression analysis by using at least one or more actual result values in the fourteenth step of calculating the coefficient of the inter-layer growth rate model.

7. The manufacturing method of a semiconductor photonic device substrate according to claim 6,
    wherein there are at least two or more growth rates of films to be an input of a model, and the coefficient of the inter-layer growth rate model is calculated by using at least one or more actual result values which are smaller in number than the number of inputs of the model in the fourteenth step of calculating the coefficient of the inter-layer growth rate model.

* * * * *